United States Patent [19]

Yamashita

[11] Patent Number: 4,599,537
[45] Date of Patent: Jul. 8, 1986

[54] IR LIGHT EMITTING APPARATUS WITH VISIBLE DETECTION MEANS

[76] Inventor: Shigeaki Yamashita, c/o Omron Tateisi Electronics Co., Shimokaiinji, Nagaokakyo-shi, Kyoto, Japan

[21] Appl. No.: 489,105

[22] Filed: Apr. 27, 1983

[30] Foreign Application Priority Data

Apr. 30, 1982 [JP] Japan .............................. 57-63640[U]
May 31, 1982 [JP] Japan .............................. 57-80131[U]

[51] Int. Cl.$^4$ ...................... H05B 33/02; H01L 33/00
[52] U.S. Cl. .................................. 313/501; 313/512; 350/96.1
[58] Field of Search ............... 313/501, 502, 503, 512; 250/494.1, 495.1; 350/96.1, 96.15, 96.2

[56] References Cited

U.S. PATENT DOCUMENTS 3,774,086  11/1973  Vincent, Jr. ..................... 313/501
4,174,491  11/1979  Nakamura et al. ............. 313/512 X

FOREIGN PATENT DOCUMENTS 1328303   8/1973  United Kingdom ................ 313/501
1332462  10/1973  United Kingdom ................ 313/501

*Primary Examiner*—Palmer C. DeMeo
*Assistant Examiner*—K. Wieder
*Attorney, Agent, or Firm*—Stanley W. Sokolowski

[57] ABSTRACT

An infrared light emitting element and an infrared/invisible conversion fluroescent substance are provided, and infrared rays to be generated from said infrared light emitting element are emitted outside, and simultaneously part of said infrared rays is illuminated on said fluorescent substance and visible light rays to be generated from said fluorescent substance are emitted outside through an optical fiber.

18 Claims, 10 Drawing Figures

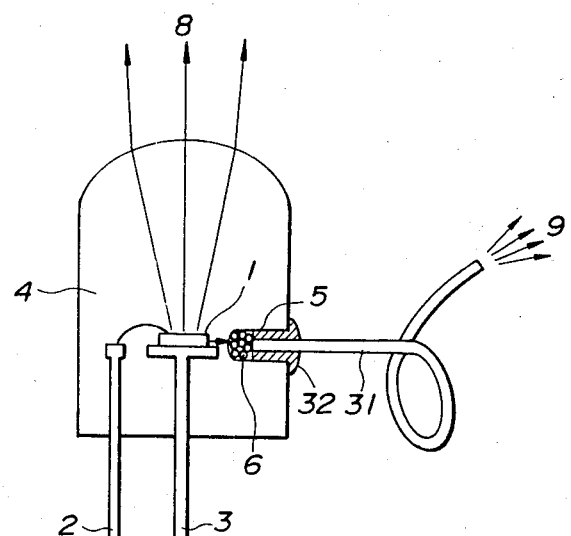
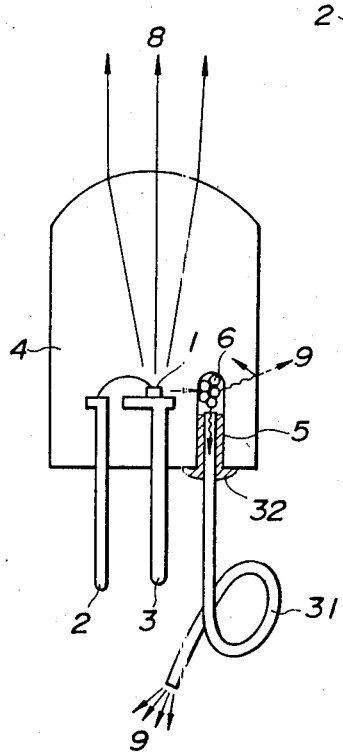
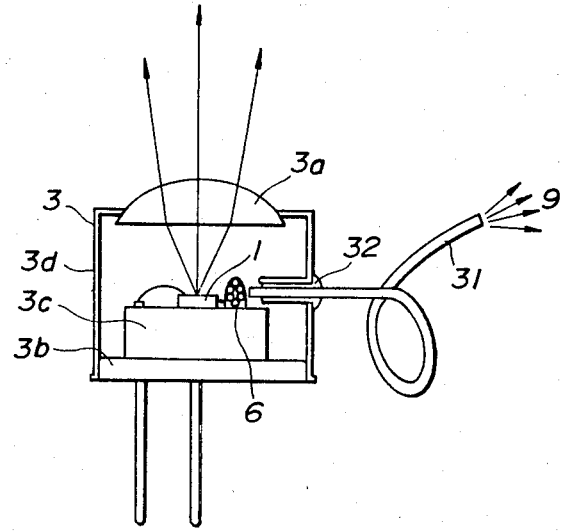

IR LIGHT EMITTING APPARATUS WITH VISIBLE DETECTION MEANS

BACKGROUND OF THE INVENTION

The present invention relates to a light emitting apparatus constituted so that infrared rays and visible rays can be simultaneously emitted.

In various photoelectric sensors such as, for instance, a photoelectric switch, a well-known infrared light emitting diode is generally used as its light source. As the reasons for the use of infrared light emitting diodes as light source in the field of photoelectric sensors, such facts can be enumerated as silicon dope and gallium-arsenic infrared light emitting diodes of which light emission efficiency is very excellent can be obtained at a very low price, infrared rays are selected for the purpose of performing detection without being affected by ambient natural rays, and the loss of infrared rays in an optical transmission route such as optical fiber, etc. is respectively small, etc.

However, one serious drawback of a photoelectric sensor using infrared light emitting diodes is that infrared light which is its measuring light, is not visible to the eyes of man. When a photoelectric sensor is acutally used, in many cases, it becomes necessary to confirm that its measuring light (infrared rays) is emitted or not, but in the case of infrared rays, this is not possible. In installing a photoelectric sensor to an object of measurement, it is also necessary to finely adjust the position of the object in relation to its measuring light, therefore a visible measuring light is convenient in such a case.

From such a point of view, the appearance of a so-called double color light emitting diode which is capable of simultaneously emitting a visible ray together with infrared rays is awaited. However, conventionally such a double color lihgt emititng diode has not been developed yet. In the field of visible light emitting diode, such diodes that are capable of simultaneously emitting multicolor lights such as green and red or green, orange and red, have already been put into practical use. However, a light emitting diode capable of simultaneously emitting infrared ray and visible ray has not been developed yet.

BRIEF SUMMARY OF THE INVENTION

The object of this invention is to provide a light emitting apparatus which is composed of an easy obtainable infrared light emitting element (for instance; infrared light emitting diode, infrared laser diode, etc.) and infrared-visible conversion fluorescent substance, and capable of simultaneously emitting infrared rays and visible rays.

Another object of this invention is to provide a light emitting apparatus of such a constitution wherein monitoring whether infrared rays are normally emitted or not can be accomplished by visible rays and those visible rays for monitoring can be guided to a position separated away from the infrared light emitting element.

Other and further objects of this invention will become obvious upon understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

FIG. 6 is the composition diagram of the fourth embodiment of this invention.

FIG. 7 is the composition diagram of the fifth embodiment of this invention.

FIG. 8 is the composition diagram of the sixth embodiment of this invention.

DETAILED DESCRIPTION OF THE INVENTION

Figure 1:
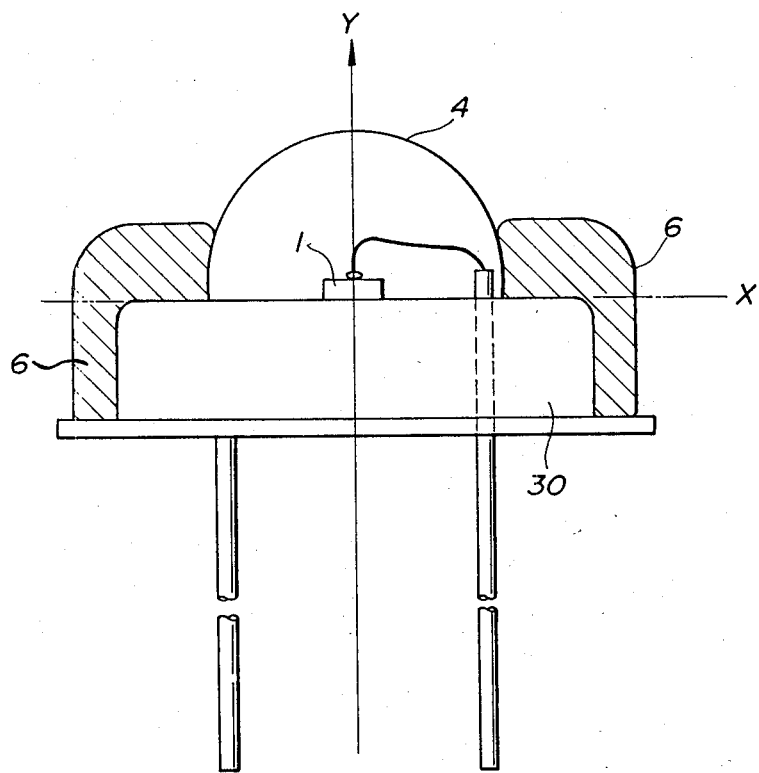
FIG. 1 is the composition diagram of the first embodiment of this invention.
Figure 2:
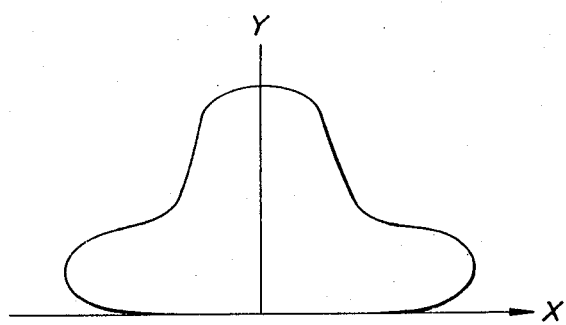
FIG. 2 is the directivity characteristic diagram of the infrared light emitting diode of FIG. 1.

The light emiting apparatus shown in FIG. 1 uses a GaAs infrared light emitting diode 1 doped with a general silicon Si. The wavelength of emitted light of this infrared light emitting diode 1 is distributed in a very narrow range of 900~1000 nm. The infrared light emitting diode 1 is die-bonded on a stem 30 in the condition of a chip, and a very thin lead wire is bonded its upper surface. FIG. 2 shows the directivity characteristic of the infrared light emitting diode 1 die-bonded to the stem 30. As shown in the figure, the diode shows a large emission characteristic in the direction of an optical axis perpendicular to the surface of the stem 30, Y direction, and it also shows a considerably large emission characteristic in the direction of X rectangular thereto.

The infrared light emitting diode 1 on the stem 30 is molded with a semi-spherical transparent resin 4. Infrared rays from the infrared light emitting diode 1 are emitted outside through the semi-spherical transparent resin 4. The semi-spherical transparent resin 4 performs action like a lens.

An infrared/visible conversion fluorescent element 6 formed in the shape of a ring is provided so as to cover the peripheral portion of the direction of Y optical axis of the semi-spherical transparent resin 4, except its front portion, and the peripheral portion of the stem 30. This ring-like fluorescent element 6 is formed by transparent resin such as silicon rubber or epoxy resin wherein particles of fluorescent substance which generate visible rays by being excited by infrared rays from the infrared light emitting diode 1 are dispersed. As this infrared/visible conversion fluorescent substance, a fluorolanthanide family fluorescent substance, for instance, a fluoroyttrium predominant fluorescent substance with erbium used as an activator ($YF_3 + Er^{3+}$) is used.

The internal surface of the ring-like fluorescent element 6 is brought to contact with the outer surface of the semi-spherical transparent resin 4, and part of infrared rays emitted from the infrared light emitting diode 1, components to be emitted at an angle close to the X axis perpendicular to the Y optical axis shown in FIG. 2, enters the ring-like fluorescent element 6 and excites fluorescent substance dispersed therein. By this, visible rays are generated from the ring-like fluorescent element 6 and emitted from the surface of the fluorescent element 6. Part of visible rays emitted from the fluorescent element 6 becomes parallel with infrared rays to be emitted in the direction of Y optical axis from the front portion of the semi-spherical transparent resin 4.

Figure 3:
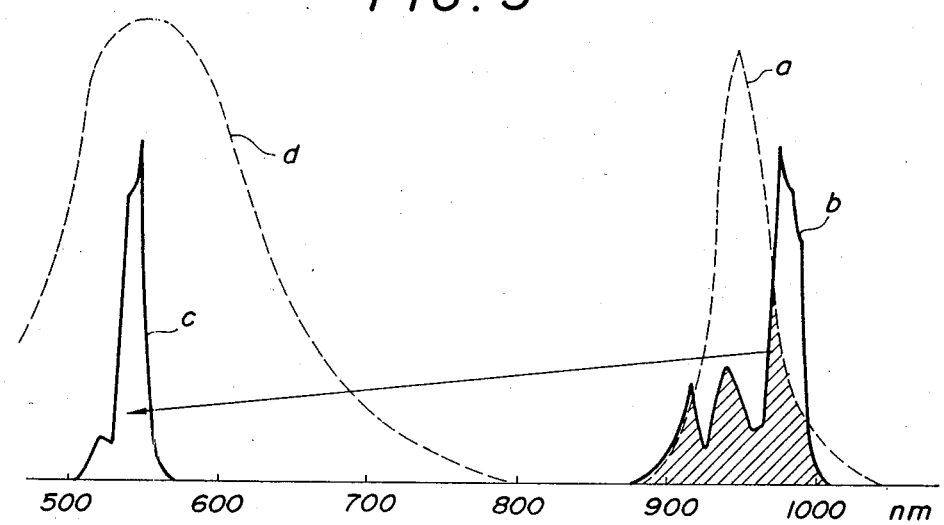
FIG. 3 is a spectrum characteristic diagram for explaining the operation of the apparatus of FIG. 1.

In the spectrum diagram of FIG. 3, (a) shows the light emission spectrum characteristic of the silicon doped GaAs infrared light emitting diode 1 and (b) shows the excitation spectrum characteristic of the fluorescent element 6 primarily made of fluoroyttrium, previously shown as an example. As shown in the figure, the excitation spectrum characteristic (b) is included in the light emission spectrum characteristic (a). (c) shows the light spectrum characteristic generated from said excited fluorescent element 6, and (d) shows the comparative visual sensitivity characteristic of the human eye. As shown in the figure, the light rays generated from the fluorescent element 4 are weak, but they are close to the peak wavelength of the human eye's comparative visual sensitivity characteristic and can be fully recognized by the human eye even if they are low in level.

As forementioned, in the light emitting apparatus of this embodiment, of those infrared rays emitted at a high efficiency from the infrared light emitting diode 1, major infrared rays in the direction of Y optical axis are emitted outside as they are, and those infrared rays, which are emitted in the direction of X substantially rectangular to Y optical axis and apt to become ineffective beam of light rays, are converted into visible rays by the ring-like fluorescent element 6 and they are radiated in every directions from the surface of the ring-like fluorescent element 6.

When a light emitting apparatus thus composed is used, for instance, as the light source of a photoelectric switch, infrared rays of sufficiency large output can be obtained in the direction of Y optical axis and they can be used as measuring light rays and at the same time, visible light rays are also emitted, therefore it can be easily confirmed whether the light emitting diode 1 emits light or not, and the alignment of optical axes and other works can be easily accomplished by visually confirming visible light rays emitted together with infrared rays.

The composition of the radiating unit of an infrared light emitting element is not limited to that of the semi-spherical resin shown in the figure, and also the shape of an infrared/visible conversion fluorescent element is properly decided to conform with that of the radiating unit.

Figure 4:
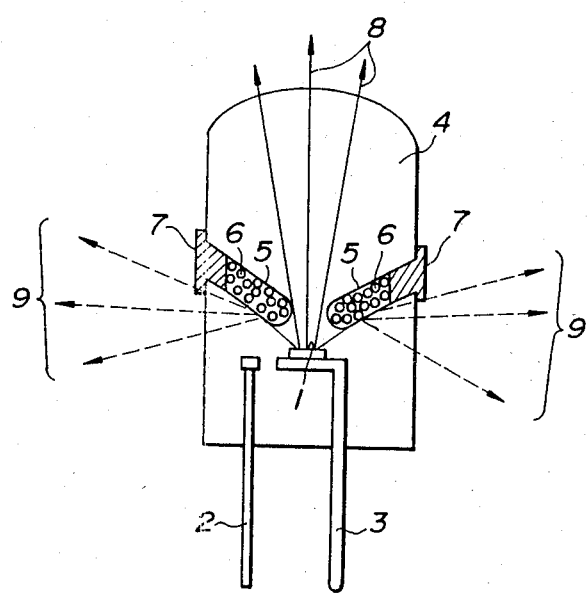
FIG. 4 is the composition diagram of the second embodiment of this invention.
Figure 5:
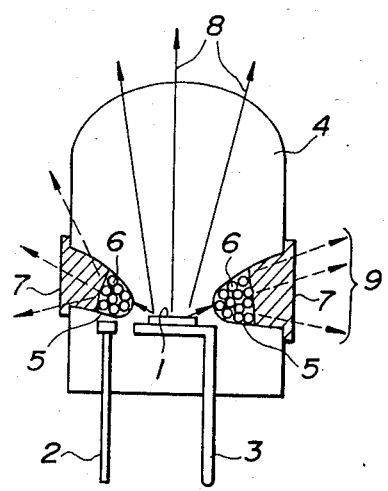
FIG. 5 is the composition diagram of the third embodiment of this invention.

FIG. 4 and FIG. 5 show the second and third embodiments of the light emitting apparatus of this invention respectively. In these embodiments, the Si doped GaAs infrared light emitting diode 1 is used like the previous embodiment.

The infrared light emitting diode 1 is bonded on lead frames 2 and 3 in the form of a chip and they are completely molded with transparent resin. This transparent molded resin portion 4 is formed into the shape of a column of which axis is aligned with the main optical axis of the light emitting diode 1 and its front end portion is formed into the shape of a semi-sphere used as a radiating unit performing the action of a lens.

On said transparent mold resin portion 4, plural holes 5, which reach the vicinity of the chip of the light emitting diode 1 inside the resin from the central portion of its outer circumference, are drilled in the form of radiation and those holes are filled with powders of an infrared/visible conversion fluorescent substance 6 and their openings are resin-sealed with a lid 7. As the infrared/visible conversion fluorescent substance 6, a fluorescent substance composed of fluoride of rare earth element with ytterbium and erbium added as activators is used, and this substance, being excited by infrared rays from said infrared light emitting diode 1, generates visible light rays. From a fluorescent element 6 primarily made of $YF_3$, green emitting light of 544 nm can be obtained and when a fluorescent element 6 primarily made of YOCL, red emitting light can be obtained.

In the light emitting apparatus composed as aforementioned, the main optical axis of the infrared light emitting diode 1 substantially coincides with the denter axis of the mold resin unit 4 and faces toward its front dome portion and the infrared light emitting diode 1 also emits infrared rays of a considerable level in the direction substantially rectangular to the main optical axis. Arrows 8 of FIG. 4 and FIG. 5 indicate infrared rays emitted from the infrared light emitting diode 1, and as clearly known from the figure, those infrared red rays which are emitted with a certain angle to said main optical axisare illuminated on the fluorescent particles 6 filled in the holes 5 and they are excited. With this, visible rays are generated from the fluorescent element 6 as shown by dotted lines of arrows 9 in the figure, and those visible rays pass through the transparent mold resin unit 4 or the lid 7 and are emitted outside. By this method, infrared rays and visible rays are simultaneously emitted.

The difference between the embodiment of FIG. 4 and that of FIG. 5 is such that the embodiment of FIG. 4 is considered so that reflected fluorescent light rays are primarily emitted outside, while the embodiment of FIG. 5 is considered so that permeated fluorescent light rays are primarily emitted outside. In the case of FIG. 5, the lid 7 which resin seals holes 5 is composed of transparent resin.

It is desirable that holes 5 to be formed in said mold resin unit 4 be formed by pins protruded inside a metal mold at the time of molding the resin unit 4. At that time, the holes 5 should be formed so that its top end approaches the chip of the infrared light emitting diode 1 as close as possible.

When the hole 5 is to be resin sealed after it is filled with fluorescent particles, it may be sealed by such a method whereby soft resin is pured into the opening of the hole 5 and it is caused to solidify for sealing, not by using the lid 7 which is separately formed in advance. In this case, it is desirable that the hole be sealed with a resin prepared to a high viscosity so that fluoresscent particles 9 inside the hole are not enveloped with resin composing the lid 7.

In the embodiments of FIG. 4 and FIG. 5, such an easy manufacturing method is adopted whereby holes are drilled in the mold resin unit and holes are filled with fluorescent particles which can be arranged very close to the light emitting element chip and their infrared/visible light conversion efficiency is high and it is possible to obtain visible light rays of such a level that can be sufficiently recognized by the human eye.

FIG. 6, FIG. 7 and FIG. 8 show embodiments of this invention which are composed so that visible light rays generated by said infrared/visible conversion fluorescent element 6 are guided to outside through optical fibers respectively.

In the embodiment of FIG. 6, like the embodiments of FIG. 4 and FIG. 5, the infrared light emitting diode 1 is bonded on lead frames 2 and 3 in the form of a chip and they are completely molded with transparent resin. This transparent resin portion 4 is formed into the shape of a column and on its outer circumference, holes 5 which reach the vicinity of the internal infrared light emitting diode chip 1 are drilled. The holes 5 are filled with powders of infrared/visible conversion fluorescent substance 6. One end of an optical fiber 31 is inserted into the hole 5 and it is fixed with synthetic resin 32.

The infrared/visible conversion fluorescent element 6, upon receipt of part of infrared rays to be emitted from the infrared light emitting diode 1, generates visible light rays. Part of the visible light rays enters one end of the optical fiber 31 and is guided through the fiber 31 and emitted outside from its other end. Arrows of FIG. 6 show visible light rays to be emitted from the optical fiber 31. Here, if the length of the optical fiber is made sufficiently longer, it is possible to confirm the emission of the infrared light emitting diode 1 by means of visible light rays at a position separated away from the main body of the light emitting apparatus.

The embodiment of FIG. 7 differs from that of FIG. 6 in the following points. In the embodiment of FIG. 7, the hole 5 is formed from the underside of the columnar mold resin portion 4 primarily reflected fluorescent light rays from the fluorescent substance 6 are guided to the optical fiber 31.

In the embodiment of FIG. 8, the infrared light emitting diode 1 and the infrared/visible conversion fluorescent substance 6 are accommodated in a package 3. This package 3 is composed of a stem 3b, a heat sink 3c mounted on the stem 3b, a hollow container 3d covering the upper portion of the stem 3b and a lens 3a installed to the upper surface of the container 3d which becomes an emission window. The chip of the light emitting diode 1 is bonded on the heat sink 3c directly under the lens 3a. The infrared/visible conversion fluorescent substance 6 is arranged at a position very close to the side of the chip of the light emitting diode 1 on the upper surface of the heat sink 3c. the optical fiber 31 penetrates through the circumference of the container 3d and is fixed with resin 32 and its one end is arranged in the vicinity of the fluorescent substance 6. In the case of this embodiment, since the infrared light emitting diode 1 and the fluorescent substance 6 are arranged on the heat sink 3c, the influence of heat is small and the extinction of light by heat of the fluorescent substance can be made very small and the emission of visible light rays of high efficiency can be obtained.

Figure 9:
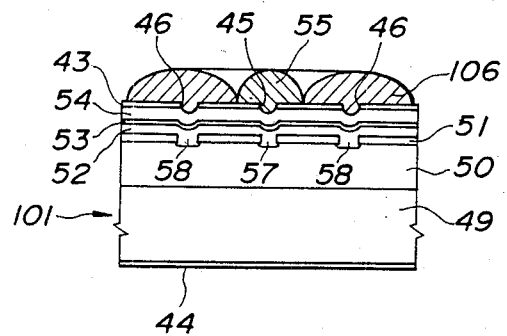
FIG. 9 is the composition diagram of the seventh embodiment of this invention.
Figure 10:
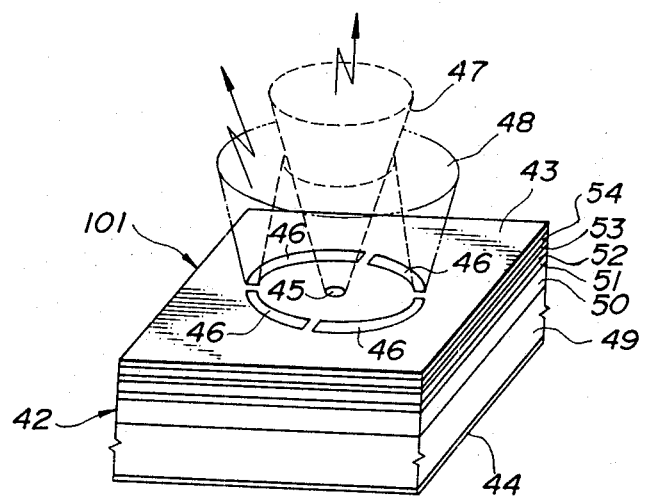
FIG. 10 is a diagonal view of the infrared light emitting diode used in the seventh embodiment.

FIG. 9 shows the seventh embodiment of this invention and FIG. 10 shows only the infrared light emitting diode 101 used in the light emitting apparatus of the seventh embodiment.

This infrared light emitting diode 101 is composed of a semiconductor chip 42 made of GaAs and electrodes 43 and 44 formed on the both sides of the chip. One electrode 43 is provided with a light emission area in the shape of a spot and four divisions of light emission area in the shape of an arc 46 which are arranged so as to encircle the spot area. As a result of this, the light emission area 45 emits a converged beam light 47 and the light emission area 46 emits a ring-shape light 48 enveloping the beam light 47. Consequently, said light emitting diode 101 sends out infrared rays only toward the front portion perpendicular to the electrode 43 and the beam light 47 and the ring-shape light 48 are generated so that they overlap each other in front of the electrode 43.

In this embodiment, the semiconductor chip 42 is composed of a $n^+$-GaAs substrate 49, n-GaAs (Te dope) substrate 50, p-GaAs (Zn dope) layer 51, n-GaAs (Te dope) layer 52, GaAs (not dope) layer 53 and p-GaAs (Zn dope) layer 54.

In the p-GaAs layer 51 corresponding to the light emission areas 45, 46, a current constricting portion 57 in the shape of spot and another current constricting portion 58 in the shape of a circular ring are formed by etching. These current constricting portions 57, 58 effectively act to generate infrared rays of high brilliance.

In the embodiment of FIG. 9, said infrared light emitting diode 101 is used. Said light emission area 45 of the infrared light emitting diode 101 is covered with semi-spherical transparent resin 55, and said light emission area 46 is covered with a unit of infrared/visible conversion fluorescent substance 106 formed into the shape of a ring.

Said transparent resin 55 is composed of silicon rubber and epoxy resin, etc. Said infrared/visible conversion fluorescent substance 106 is formed by transparent resin such as silicon rubber, epoxy resin, etc. wherein particles of fluorescent substance which, being excited by infrared rays from the light emission area 46, generate visible rays are dispersed.

Consequently, the beam of infrared rays to be generated by the light emission area 45 permeates through the transparent resin and is sent outside. Also, part of the beam of infrared rays generated from the light emission area 46 permeates through the infrared/visible conversion fluorescent substance 106 and is emitted outside, but at the same time it causes the fluorescent substance 106 to excite. Visible light rays are generated by the excited fluorescent substance 106 and they are emitted outside. These visible light rays exist in such condition wherein they envelope the beam of infrared rays generated from the light emission area 45.

As many apparently widely different embodiments of the present invention may be made without departing from the spirit and scope thereof, it is to be understood that the invention is not limited to the specific embodiments thereof except as defined in the appended claims.

What is claimed is:

1. A light emitting apparatus capable of simultaneously emitting infrared rays and visible rays, comprising in combination:
    a sealed infrared light emitting element which emits infrared light to the outside of said apparatus;
    a fluorescent substance which converts infrared into visible light located in proximity to said infrared light emitting element; and
    an optical fiber means connected with said fluorescent substance which guides the visible light rays produced by said fluorescent substance to the outside of said apparatus.

2. The light emitting apparatus of claim 1 wherein said sealed light emitting element is made of Si doped GaAs light emitting diode.

3. The light emitting apparatus of claim 1 wherein said sealed light emitting element is molded with transparent resin.

4. The light emitting apparatus of claim 3 wherein the transparent resin molding said infrared light emitting element has a semi-spherical portion serving as a main emission portion of infrared rays.

5. The light emitting apparatus of claim 4 wherein the transparent resin molding said infrared light emitting element is formed into substantially columnar shape having at its top end a semi-spherical portion serving as a main emission portion of infrared rays.

6. The light emiting apparatus of claim 1 wherein said sealed light emitting element is sealed in a package having a window portion through which infrared rays are emitted outside.

7. The light emitting apparatus of claim 1 wherein said sealed light emitting element is formed into one semiconductor chip and said semiconductor chip has plural light emission areas on its surface.

8. The light emitting apparatus of claim 7 wherein said semiconductor chip has on its surface one light emission area in the shape of a spot and plural light emission areas in the shape of an arc arranged to encircle the spot area.

9. The light emitting apparatus of claim 1 wherein said fluorescent substance is of fluorolanthanide family fluorescent substance.

10. The light emitting apparatus of claim 3 wherein said fluorescent substance is formed by being dispersed in the transparent resin.

11. The light emitting apparatus of claim 4 wherein said fluorescent substance is dispersed in the transparent resin and formed into the shape of a ring and this ring is embedded around said semi-spherical portion.

12. The light emitting apparatus of claim 7 wherein part of said plural light emission areas is covered by said fluorescent substance.

13. The light emitting apparatus of claim 8 wherein said plural light emission areas in the shape of an arc are covered in the shape of a ring by the transparent resin in which said fluorescent substance is dispersed.

14. The light emitting apparatus of claim 3 wherein holes drilled in said transparent resin molding said infrared light emitting element are filled with said infrared/visible conversion fluorescent substance.

15. The light emitting apparatus of claim 14 wherein said fluorescent substance in said holes is sealed by a lid made of transparent resin.

16. The light emitting apparatus of claim 14 wherein one end of said optical fiber is inserted into said hole and fixed thereto for the purpose of guiding outside visible light rays generated from said fluorescent substance.

17. The light emitting apparatus of claim 6 wherein said fluorescent substance is arranged near at the side of said infrared light emitting element in said package and an optical fiber for guiding outside visible light rays generated from said fluorescent substance is installed so that it penetrates through said package.

18. The light emitting apparatus of claim 1 wherein said fluorescent substance is arranged sideways from the main optical axis of said infrared light emitting element.

* * * * *